(12) United States Patent
Peterson et al.

(10) Patent No.: US 12,040,207 B2
(45) Date of Patent: Jul. 16, 2024

(54) APPARATUS AND METHOD FOR ORIENTATION OF SEMICONDUCTOR DEVICE DIE

(71) Applicant: Rohinni, Inc., Liberty Lake, WA (US)

(72) Inventors: Cody Peterson, Hayden Lake, ID (US); Keenan Allison, Coeur d'Alene, ID (US); Brian Miner, Valleyford, WA (US); Sean Kupcow, Greenacres, WA (US)

(73) Assignee: Rohinni, Inc., Liberty Lake, WA (US)

( * ) Notice: Subject to any disclaimer, the term of this patent is extended or adjusted under 35 U.S.C. 154(b) by 50 days.

(21) Appl. No.: 17/388,621

(22) Filed: Jul. 29, 2021

(65) Prior Publication Data

US 2022/0037185 A1    Feb. 3, 2022

Related U.S. Application Data

(60) Provisional application No. 63/059,071, filed on Jul. 30, 2020.

(51) Int. Cl.
*H01L 21/68*     (2006.01)
*H01L 21/67*     (2006.01)

(52) U.S. Cl.
CPC ........ *H01L 21/68* (2013.01); *H01L 21/67271* (2013.01)

(58) Field of Classification Search
CPC .. H01L 21/68; H01L 21/67271; B65G 47/525
USPC ............................................. 414/555; 438/3
See application file for complete search history.

(56) References Cited

U.S. PATENT DOCUMENTS

| | | | | |
|---|---|---|---|---|
| 4,974,390 A | * | 12/1990 | Gill | H05K 13/021 53/446 |
| 5,133,636 A | * | 7/1992 | Hunt | H05K 13/022 406/87 |
| 2007/0178658 A1 | * | 8/2007 | Kelley | H01L 21/02628 257/E21.464 |
| 2011/0073439 A1 | * | 3/2011 | Ota | B65G 47/525 198/392 |
| 2015/0357526 A1 | * | 12/2015 | Huska | G03G 15/043 438/3 |
| 2016/0276205 A1 | | 9/2016 | Huska et al. | |
| 2018/0141163 A1 | * | 5/2018 | Wendt | B23K 26/0846 |

OTHER PUBLICATIONS

Search Report and Written Opinion for PCT Application No. PCT/US21/43871, mailed Oct. 21, 2021, 7 pages.

* cited by examiner

*Primary Examiner* — Lynn E Schwenning
(74) *Attorney, Agent, or Firm* — Lee & Hayes P.C.

(57) ABSTRACT

An apparatus for aligning and orienting a semiconductor die ("die") to be transferred to a substrate. The apparatus includes an alignment mechanism to align the die to be queued among a plurality of die; and an orientation mechanism to orient the die using magnetism to be positioned in a predetermined position prior to transfer to the substrate. The alignment mechanism further transports the die to be positioned at a feeding position for supply to a die transfer system.

18 Claims, 4 Drawing Sheets

APPARATUS AND METHOD FOR ORIENTATION OF SEMICONDUCTOR DEVICE DIE

BACKGROUND

The conventional fabrication of semiconductor devices typically involves an intricate manufacturing process with a myriad of steps. As part of the process, a large wafer (e.g., 300 mm or less in diameter) goes through a singulation process in which the wafer is diced into a multitude of semiconductor devices, which are commonly referred to as die. (Note, it is acceptable in the industry to use "dies" or "die" to indicate a plurality of diced semiconductor devices (i.e., components), and as such, the term "die" as used herein may mean one or more than one semiconductor device. Further, the intended quantity is generally understood in the context of the sentence/paragraph in which "die" is found.)

During the singulation process, the semiconductor wafers are generally held on a "wafer tape." Wafer tape is a flexible planar material pulled taut to provide a surface against which the semiconductor wafer may be secured for subsequent processing of the diced die. At least one side of the wafer tape generally has an adhesive material on the surface to secure the singulated die of the semiconductor wafer to the wafer tape. Inasmuch as the freshly singulated die are unpackaged at the point of dicing, conventionally, the unpackaged die are then "packaged" prior to use. Here, the "unpackaged" modifier refers to an unenclosed semiconductor device without protective features, while the "packaged" modifier refers to the enclosure "package" material of protective features built into/on/over the final product of the semiconductor device, as well as the interface that enables the device in the package to be incorporated into an ultimate circuit.

Generally, the industry practice has used packaged semiconductor devices (i.e., enclosed and/or implemented in ICs) in products. Thus, for die that continue to a packaging action before placement or transfer to a different substrate, the time and actions involved in processing between the wafer handling and final output may be referred to as "die preparation." Alternatively, in recent times, some companies have begun implementing raw die (i.e., also referred to as "unpackaged" as above, or "bare" die), in which cases, the die may remain unpackaged and minimal additional processing occurs. A benefit of placing unpackaged die is that the die are transferred without additional processing first, which reduces the time to form products. Or in some cases, though the die may have been transferred while unpackaged, the die may have been subsequently further processed and enclosed in place on the substrate, prior to distribution or further implementation in a product, which still may save time and efforts.

In the event a die is to be a packaged die, in some instances, the packaging increases a size of the raw die as much as 10 times. This increase in thickness is a limiting factor in the ability to manufacture products, such as display screens, that are desired to be as slim as possible. Moreover, due to the increasing trend to move to smaller miniLEDs or even microLEDs (see definitions below), the technology involved is constantly evolving to minimize the costs associated with processing the smaller die, as well as to maintain the die as slim as possible.

Turning back to the singulation portion of fabricating a semiconductor device, such as an LED, the starting semiconductor wafers may vary in size and overall dimensions. Regardless of the size of a wafer, where one wafer may be diced into hundreds of semiconductor devices, another wafer may be diced into a significantly larger number of semiconductor devices. Despite size differences, each semiconductor device may be implemented as a semiconductor component in a circuit. With specific respect to LED components, current industry uses of LEDs implement LEDs of a "standard" size (e.g., semiconductor components having a greatest lateral dimension measuring approximately greater than 300 microns), a "mini" size (e.g., semiconductor components having a greatest lateral dimension measuring between approximately 100 microns to approximately 300 microns), or a "micro" size (semiconductor components having a greatest lateral dimension measuring between approximately 5 microns to approximately 100 microns).

Note, while the approximate sizes listed of the different named groups, e.g., "standard," "mini," and "micro," of semiconductor devices are considered for the purposes of this disclosure to be generally accepted industry-wide, it is possible that some entities in the industry may associate different dimension ranges with the groups listed. Nevertheless, for the sake of this application, the approximate size ranges of LEDs above are intended to be applied when stated hereinafter, where the terms "approximate" and "approximately" are similarly intended to be understood with respect to the scale in size as is determined by those skilled in the art. Further, in practice, it is generally accepted that "miniLEDs" are smaller than "standard" LEDs, and "microLEDs" are smaller than "miniLEDs." Moreover, it is understood by those skilled in the art that a decrease in the size of the semiconductor component being used generally increases the difficulty in subsequent processing and implementation (i.e., transfer) into electronic circuits.

Despite the simplistic description above, since a wafer may be diced into thousands or millions of die, subsequent implementation of the die remains an incredibly complex process. That is, challenges exist in accurately transferring and placing the die from the wafer to a circuit, regardless of size. However, as stated above, the smaller the die, the greater the challenge of effective transfer and circuit placement. Accordingly, there exists opportunities to improve the processes and machines involved in these transfers.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
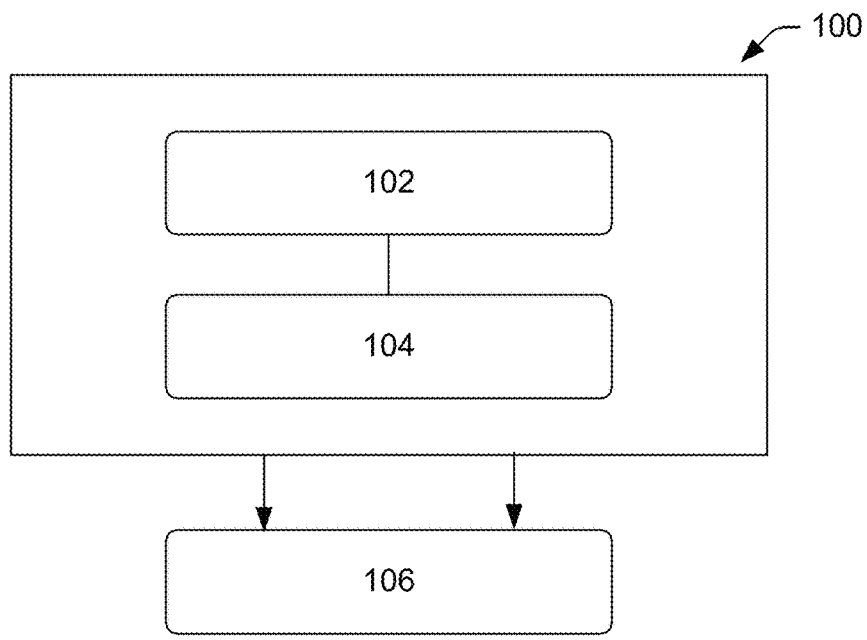
FIG. 1 illustrates a schematic view of a die alignment and orientation system coupled with a semiconductor device die transfer system, according to an embodiment of the disclosure.

This disclosure is directed to an apparatus and/or component thereof for transferring semiconductor device die to a circuit and to the process for achieving the same. Additionally, this disclosure is directed to an apparatus and method of orienting semiconductor device die to be properly aligned for transfer to a circuit. In a particular example embodiment, the disclosure is directed to an apparatus for orienting microLEDs to be in a state prepared to be transferred to a substrate. In an embodiment, a machine (which could be one of a variety of types of transfer machines) functions to transfer unpackaged die from an apparatus that properly orients and aligns the microLEDs for feeding to the transferring machine so that multiple die may be transferred sequentially and/or simultaneously to a product substrate, such as a circuit substrate.

The transfer of unpackaged semiconductor device die, such as unpackaged microLEDs, using an apparatus to orient and align the microLEDs, as discussed herein below, provides an opportunity to significantly increase the speed of a production of an end product in which the microLEDs are implemented. Furthermore, the ability to accurately place properly oriented microLEDs also provides a quality-minded produce with the bonus of a reduction in thickness of the end product (i.e., a display screen, or a circuit for a display, or other electronic device) compared to a similar end product produced with conventional packaged die. Additionally, use of the machine and methods associated therewith as described according to an embodiment disclosed herein may also reduce the amount of time and/or cost to manufacture the end product.

For example, in an embodiment, the disclosed apparatus for orienting and aligning semiconductor device die (e.g., unpackaged miniLEDs or unpackaged microLEDs) may be configured to couple with an apparatus or system to transfer the oriented and aligned die to a substrate. The apparatus or system to transfer the die may be the same as or similar to any or all of the apparatuses or systems (which may also be referred to as machines, devices, etc.) disclosed in the following patents: U.S. Pat. Nos. 9,502,625, 9,633,883, 10,062,588, 10,471,545, 10,141,215, 10,504,767, 10,566,507, and 10,410,905. Moreover, the content of each of the above patent applications is incorporated by reference in their entireties. Further, the multitude of embodiments of transfer apparatuses known, though not expressly shown or described herein or disclosed in the above-listed patents, may be modified to be compatible with the one or more embodiments of the disclosed apparatus for orienting and aligning singulated semiconductor device die.

Note, these patents are listed merely to illustrate some examples of potential transfer apparatuses. Thus, this list does not imply that options for a transfer apparatus are limited only to devices that can be construed to be consistent with the claims in the allowed patents. Rather, it is contemplated that any version or embodiment of a transfer apparatus that might be conceived based on the disclosures in the patents above should be considered an option. That is, the disclosed apparatus and method for the alignment and orientation of the die may be modified to couple or be otherwise implemented with a variety of apparatuses. Use of a transfer apparatus as cited above may provide rapid transfer capability, which takes advantage of the benefits of the instant disclosure, namely the ability to orient and align the semiconductor device die in preparation for rapid transfer. Further, the options for compatible machines may include other embodiments claimed in related continuation or divisional applications proceeding from these cited patents, as well as variations claimed or recited in related foreign applications and patents as currently existing or to be captured in future claims. Moreover, it is contemplated that other known devices may be modified to accommodate the disclosed apparatus, as well.

For the purpose of this description, the term "substrate" refers to any substance on which, or to which, a process or action occurs. Further, the term "product" refers to the desired output from a process or action, regardless of the state of completion. Thus, a product substrate refers to any substance on which, or to which, a process or action is caused to occur for a desired output. Herein, the term "product substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; another semiconductor device die, so as to stack die on each other; and a cloth material of cotton, nylon, rayon, leather, etc. The choice of material of the product substrate may include durable materials, flexible materials, rigid materials, and other materials with which the transfer process is successful, and which maintain suitability for the end use of the product substrate. The product substrate may be formed solely or at least partially of conductive material such that the product substrate acts as a conductive circuit for forming a product. The potential types of product substrate may further include items, such as glass bottles, vehicle windows, or sheets of glass.

In an embodiment, the product substrate may include a circuit trace disposed thereon. The circuit trace, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace may be sized according to the size of the die being transferred to ensure proper connectivity and subsequent activation of the die. For example, the circuit trace may have a trace spacing, or gap ranging from about 10 to 200 microns, about 100 to 175 microns, or about 125 to 150 microns.

The circuit trace may be formed from a conductive ink disposed via screen printing, inkjet printing, laser printing, manual printing, or other printing means. Further, the circuit trace may be pre-cured and semi-dry or dry to provide additional stability, while still being activatable for die conductivity purposes. A wet conductive ink may also be used to form the circuit trace, or a combination of wet and dry ink may be used for the circuit trace. Alternatively, or additionally, the circuit trace may be pre-formed as a wire trace, or photo-etched, or from molten material formed into a circuit pattern and subsequently adhered, embedded, or otherwise secured to the product substrate.

The material of the circuit trace may include, but is not limited to, silver, copper, gold, carbon, conductive polymers, etc. In an embodiment, the circuit trace may include a silver-coated copper particle. A thickness of the circuit trace may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in one non-limiting example, the product substrate may be a flexible, translucent polyester sheet having a desired circuit pattern screen printed thereon using a silver-based conductive ink material to form the circuit trace.

Illustrative Embodiments of an Apparatus to Orient and Align LEDs for Transfer

As depicted in FIG. 1, a system 100 for rapid die loading and rapid die transfer may include a die alignment and orientation system 102 coupled with a semiconductor device die transfer system 104. The system 100 is configured to align and orient die using the die alignment and orientation system 102 and then transfer the die onto a substrate 106 (as defined above) using the semiconductor device die transfer system 104.

Figure 2:
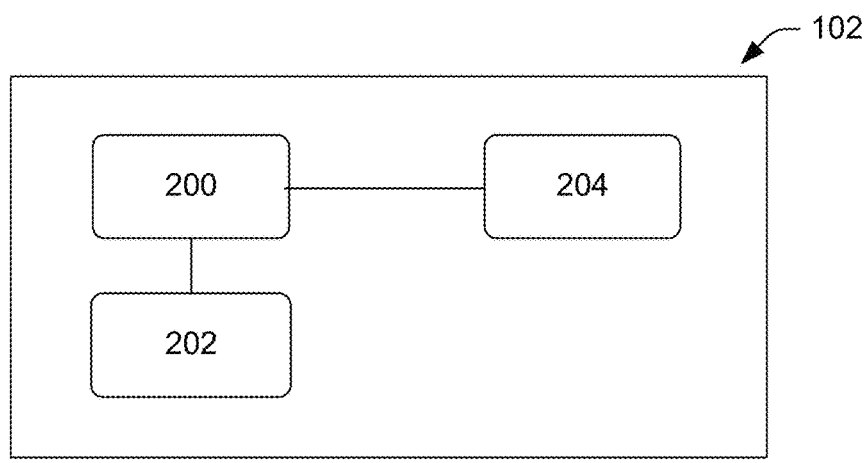
FIG. 2 illustrates a schematic view of a die alignment and orientation system as in FIG. 1, according to an embodiment of the disclosure.

As depicted in FIG. 2, the die alignment and orientation system 102 as in FIG. 1 may include an alignment mechanism 200 and an orientation mechanism 202. Though both are depicted, it is contemplated that there may be instances in which only either alignment or orientation of the die may be requested. As such, it is contemplated that the alignment mechanism 200 may be used alone (and thus independently provided) and/or that the orientation mechanism 202 may be used alone (and thus also independently provided).

The alignment mechanism 200 may include a plurality of channels (not shown in FIG. 2, see FIG. 4) in which semiconductor device die are inserted. The plurality of channels may be formed as open channels defined as a continuously extending space bounded by at least three sides, where a fourth side (i.e., an enclosing side, assuming a bottom side is connected to two opposing sides, where a top or fourth side would enclose the channel, if in place). The open channel embodiment may be fully and continuously open along one side or the same side may be intermittently open such that intermittent holes or extended apertures may be interspersed along a length thereof to allow fluid flow to escape therethrough. Alternatively, the plurality of channels may be closed channels, such as capillary tubes for example. The plurality of channels may further be arranged in an alignment position respectively to each other and with respect to a feeding position, at which the aligned die are fed or supplied to the semiconductor device die transfer system 104. The feeding position may be disposed within a housing or portion of the semiconductor device die transfer system 104 or adjacent to a receiving/supply port position of the semiconductor device die transfer system 104. As such, the semiconductor device die transfer system 104 receives die that are aligned and properly oriented to be transferred to the substrate 106.

Furthermore, the alignment mechanism may be connected to a fluid supply 204 such that the plurality of capillary tubes are supplied with a fluid flowing therein, on which the semiconductor device die are "floated" or moved through the plurality of tubes, respectively. The fluid may be a liquid or a gas. In an embodiment, the fluid used may include deionized water, environmental air, oxygen, an inert gas (e.g., helium, argon, nitrogen, etc.), dinitrogen, etc., or other suitable fluids that do not cause detrimental effects to the die, with respect to the functionality of the die, upon exposure thereto. Other liquids and gases are contemplated and may be selected depending on the semiconductor device die being transported.

Figure 5:
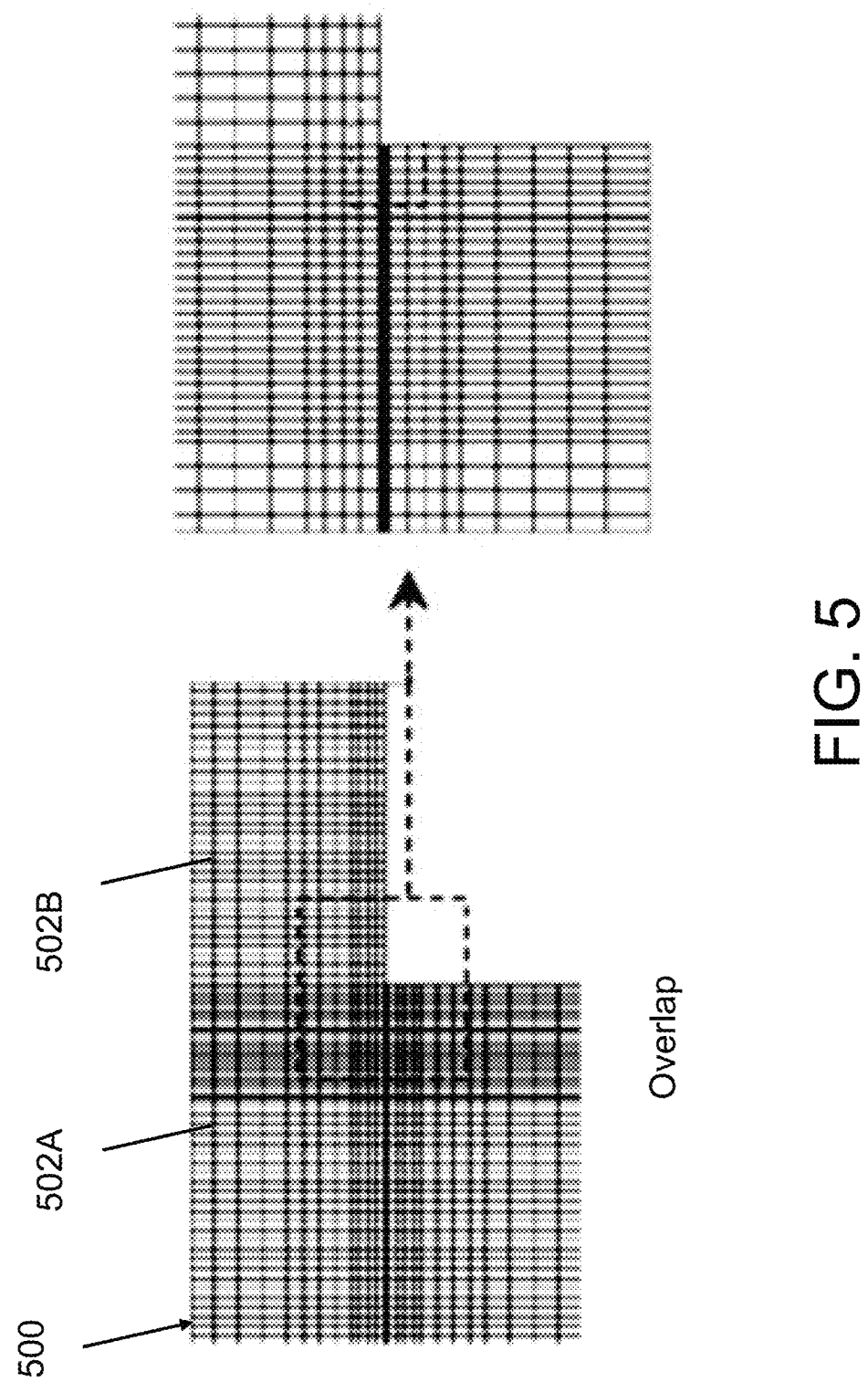
FIG. 5 illustrates a top schematic view of an fluid supply surface according to an embodiment of the disclosure.

The fluid supply 204 may include a surface 500, as shown in FIG. 5, similar to that of a modern "air hockey" type surface, but different in at least the following aspects: 1) the "air" is not limited to "air" as typically considered, but rather is more broadly open to a "fluid," as many types of fluids are considered (as discussed above); and 2) the "surface" may be formed of one or more compiled layers of a mesh material 500A and 500B, so that the interconnected strands of mesh interrupt the fluid flowing therethrough from one side toward the die scattered on the opposite side and thereby provide a laminar flow of the fluid. Thus, in an embodiment of more than one layer of a mesh material, strands of a mesh layer above a lower layer may overlap gaps between strands in the lower layer, thereby preventing an undesirable stronger, direct flow into the underside of die on the surface of the mesh layer, which flow may destabilize the movability of the die, as well as the reduce the ability to control the direction of the movement of the die. Instead, the multilayered mesh may be more effective in creating the desired laminar and stable fluid flow, which facilitates movement of the die.

Laminar air flow for use as described above may be created using various effects. For example, air cushion may be created using flow diffusion (such as with mesh), and controlling and varying volume and pressure of the fluid. Such controls to effectuate laminar flow may assist in levitating the die and surrounds the die thereby creating a fluid barrier to prevent contact with side walls of channels and/or contact with other die. Moreover, the flow rate and volume of air introduced into the laminar flow creation chamber controls the height of the die levitation and the distance between die, as well as the speed of travel of the die.

Factors that may affect the suitability of a fluid for aligning and carrying the semiconductor device die may include the size of the die (i.e., weight and/or external dimensions), the surface tension and/or friction force interaction between the material of the inner surface of the plurality of capillary tubes and the type of fluid. Further, the fluid and the amount supplied be determined based, at least in part, on the size and weight of the semiconductor device die being floated, such that the semiconductor device die are lifted sufficiently to avoid contact with the inside walls of the tube in which they are being aligned. Accordingly, the alignment mechanism 200 includes structural features selected to carefully transport a plurality of die in to align in a queued position to rapidly feed a transfer sequentially.

The orientation mechanism 202 may include fields for manipulation to manipulate the orientation of die. In an embodiment, the use of magnets and/or induced magnetic fields may be included as embodiments of the fields for manipulation to interact with the magnetic properties of semiconductor device die as they are transported along the alignment mechanism 200. By affecting the die use the properties of magnetism (e.g., magnetic flux), the die may flip or twist in different directions, thereby orienting the die and associated conductive pads that may be placed thereon in the desired orientation for transfer to the substrate 106. Moreover, in addition to magnetics, alternative embodiments of fields of manipulation may include: electrical and fluid vectors (i.e., air and liquid).

Additionally, the actuation of the field of manipulation applied by the orientation mechanism 202 may assist in detection of faulty die. Upon detection of the faulty die, the orientation mechanism 202 and/or the alignment mechanism 200 may initiate a process of rerouting the faulty die to an exit from the die alignment and orientation system 102 to prevent a faulty die from being transferred to substrate 106. Thus, the orientation mechanism 202 may include an additional feature beyond simple orientation, which is to identify and assist in eliminating faulty die from the queue such that the resulting products in which the substrate 106 is used do not suffer malfunctions or imperfections due to faulty componentry.

Figure 3:
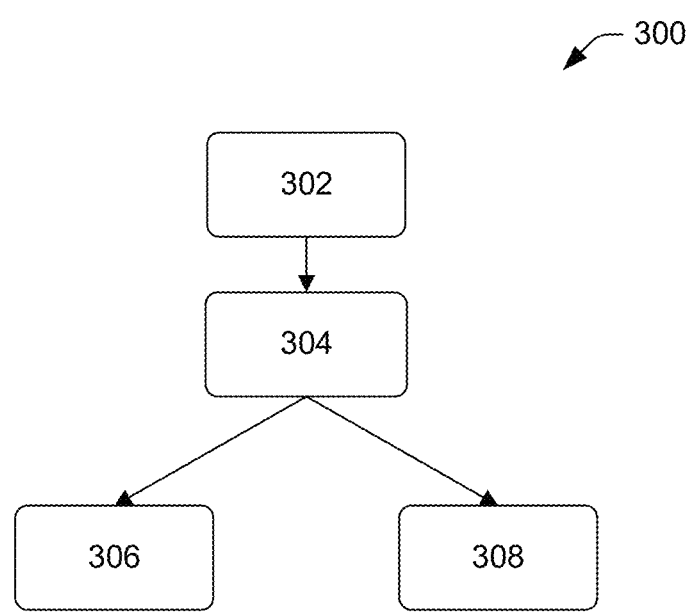
FIG. 3 illustrates a method executed via a die alignment and orientation system as in FIG. 1, according to an embodiment of the disclosure.

In FIG. 3, a flow chart illustrates a method 300 of aligning and orienting semiconductor device die for rapid transfer to a substrate. In an embodiment, method 300 may include a step 302 of aligning die within a plurality of channels to be queued for subsequent transfer to a substrate. Further, in step 304, the die may be oriented so that, when subsequently transferred, the die are prepositioned to be incorporated into the substrate with minimal positional adjustment. In step 306, the die are presented sequentially in a queue among a plurality of die at a feeding position, whereat the die are supplied to a semiconductor device die transfer system for transfer to a substrate. Alternatively, in step 308, where a die has been identified as faulty, the die is rerouted to be removed from among the plurality of die ready for rapid transfer.

Figure 4:
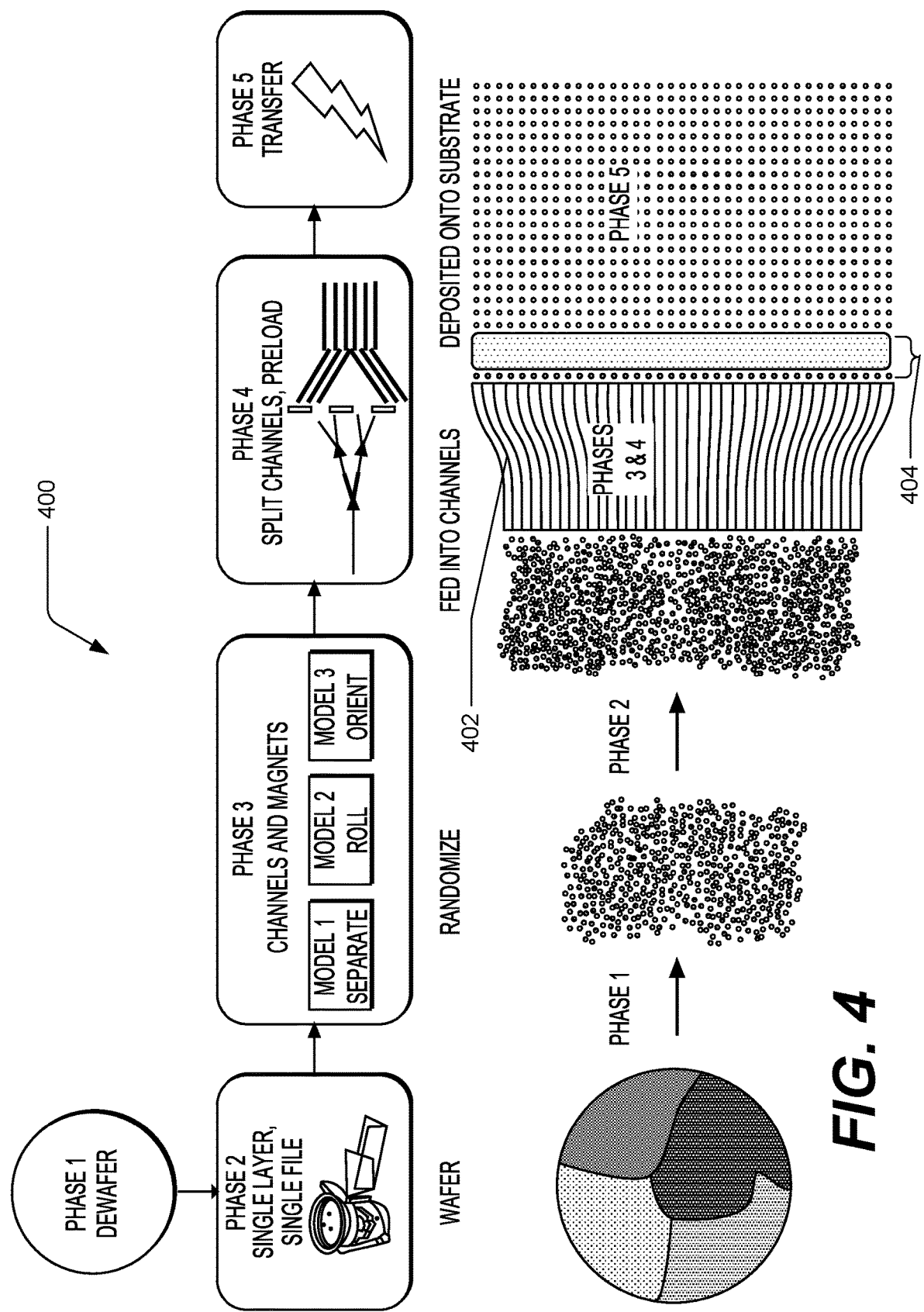
FIG. 4 illustrates a schematic view of a die alignment and orientation system and process, according to an embodiment of the disclosure.

FIG. 4 illustrates a schematic view of an embodiment of a die alignment and orientation system and process 400, according to the disclosure. The die alignment and orientation system and process 400 may include a phase 1 in which a plurality of semiconductor device die are dewafered from a semiconductor wafer. In a phase 2, the plurality of the semiconductor device die may be aligned and placed in a single layer and/or a single file line via an alignment mechanism. A phase 3 may include one or more modules in which the plurality of semiconductor device die may be separated, rolled, and oriented, as needed. Such modules may include using fields of manipulation such as magnetic fields where magnetic fields are manipulated to orient the semiconductor device die in channels. Phase 4 may be further included in the die alignment and orientation system and process 400, in which a plurality of channels 402, (e.g., capillary channels) sized to accommodate a semiconductor device die for transfer are used to feed the aligned and oriented die to a feeding position, (i.e., transfer position) to be transferred in a phase 5 and deposited to a substrate. For example, a channel 402 may have a greatest dimension of 300 microns or less. In an embodiment, the channels 402 may further have a narrowing or tapering dimension to provide a funnel effect such that die may be floated carefully and gradually into a linear and singular passing channel 402.

With respect to the channels 402, the channel design may affect the transportation of the die. For example, the width and depth of channels 402 impacts laminar flow. As such, the channels 402 are sized according to the size of the die to be transported therein, specific to the die dimensions. Further, the channel design accounts for the use of gravity and the angle to transport in relationship with the fluid flow to control the transport rate. Channels 402 may further be modified to align and stack die into "load" channels (see above), where the die are ready to be processed based on product requirements.

Notably, the fluid transportation process described herein is effective for die that have not been modified. That is, by using the magnetic flux field, die such as LED can be manipulated (x/y/theta) without modification to the die in that it is not necessary to add materials to interact with the magnet force. Additionally, with respect to sorting and accepting or rejecting die, "bad" or faulty die do not react to the flux field, meaning that good and bad components can be sorted contactless without additional time-consuming and intensive inspection. Further, in light of the ability to sort good from bad die, channel design may account for dividing channels or paths such that the magnetic force sorts the die automatically.

Conclusion

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus for aligning and orienting a semiconductor die ("die") to be transferred to a substrate, the apparatus comprising:
    an alignment mechanism to align the die to be queued, along a surface, among a plurality of die, the surface being formed of a plurality of overlapping material layers; and
    an orientation mechanism to orient the die using magnetism to be positioned in a predetermined position prior to transfer to the substrate,
    wherein the alignment mechanism further transports the die to be positioned at a feeding position for supply to a die transfer system.

2. The apparatus according to claim 1, wherein the alignment mechanism includes a plurality of capillary channels.

3. The apparatus according to claim 2, wherein the channels are sized according to a size of the die passing therethrough.

4. The apparatus according to claim 1, wherein the alignment mechanism and the orientation mechanism implement a fluid flowing from a first side of the surface to a second side of the surface at which the die are positioned, thereby creating a laminar flow of fluid via which the die are oriented and aligned and transported.

5. The apparatus according to claim 4, wherein the surface is formed of mesh materials.

6. The apparatus according to claim 1, wherein the orientation mechanism assists in sorting good die from bad die.

7. The apparatus according to claim 1, wherein the alignment mechanism operates to transport and align die via a fluid flow through a surface on which the die are located.

8. A method of aligning and orienting a semiconductor die ("die") to be transferred to a substrate, the method comprising:
    aligning the die via an alignment mechanism to be queued; and
    orienting and sorting the die via an orientation mechanism using magnetism to be positioned within a plurality of capillary channels of the alignment mechanism in a predetermined position prior to transfer to the substrate.

9. The method according to claim 8, wherein the aligning further transports the die to be positioned at a feeding position for supply to a die transfer system.

10. The method according to claim 8, wherein the channels are sized according to a size of the die passing therethrough.

11. The method according to claim 8, wherein the aligning and the orienting include flowing a fluid from a first side of a surface through a second side of the surface at which the die are positioned, thereby creating a laminar flow of fluid via which the die are oriented and aligned and transported.

12. The method according to claim 11, wherein the surface is formed of a mesh material.

13. The method according to claim 11, wherein the surface is formed of a plurality of overlapping mesh material layers.

14. The method according to claim 8, wherein the orienting includes sorting good die from bad die.

15. The method according to claim 8, wherein the aligning includes operating a fluid flow beneath the die to transport the die.

16. The method according to claim 15, wherein the fluid of the fluid flow is an inert gas.

17. A system for aligning and orienting a semiconductor die ("die") to be transferred to a substrate, the system comprising:
   an alignment mechanism to align the die to be queued among a plurality of die; and
   an orientation mechanism to orient the plurality of die using magnetism to be positioned in a predetermined position prior to transfer to the substrate,
   wherein the alignment mechanism further transports the plurality of die to be positioned at a feeding position for supply to a plurality of capillary channels, and
   wherein the magnetism sorts the plurality of die into various capillary channels of the plurality of capillary channels.

18. The system according to claim 17, wherein the plurality of die are sorted such that faulty die are forced into a particular channel of the plurality of capillary channels, or a set of channels of the plurality of capillary channels, separate from good die.

* * * * *